US012622211B2

(12) United States Patent
Zhong et al.

(10) Patent No.: US 12,622,211 B2
(45) Date of Patent: May 5, 2026

(54) METHODS AND APPARATUS FOR PROCESSING A SUBSTRATE

(71) Applicant: Applied Materials, Inc., Santa Clara, CA (US)

(72) Inventors: Yaoying Zhong, Singapore (SG); Siew Kit Hoi, Singapore (SG)

(73) Assignee: Applied Materials Inc., Santa Clara, CA (US)

( * ) Notice: Subject to any disclaimer, the term of this patent is extended or adjusted under 35 U.S.C. 154(b) by 831 days.

(21) Appl. No.: 17/875,740

(22) Filed: Jul. 28, 2022

(65) Prior Publication Data

US 2024/0038557 A1 Feb. 1, 2024

(51) Int. Cl.
H01L 21/67 (2006.01)
H10P 72/00 (2026.01)

(52) U.S. Cl.
CPC ...... H10P 72/0616 (2026.01); H10P 72/0602 (2026.01); H10P 72/0606 (2026.01)

(58) Field of Classification Search
CPC ......... H01L 21/67288; H01L 21/67248; H01L 21/67259; H01L 21/67265
See application file for complete search history.

(56) References Cited

U.S. PATENT DOCUMENTS

| | | | |
|---|---|---|---|
| 6,320,320 B1 | 11/2001 | Bailey, III et al. | |
| 8,377,744 B2 | 2/2013 | Yamazaki et al. | |
| 9,772,296 B2 * | 9/2017 | Kang ................. | G01N 21/9501 |
| 2009/0171495 A1 * | 7/2009 | Shih ........................ | H01L 22/20 |
| | | | 700/121 |
| 2009/0196717 A1 * | 8/2009 | Holden ............. | H01L 21/67259 |
| | | | 901/14 |
| 2013/0052756 A1 * | 2/2013 | Okujo .................. | H05B 3/0047 |
| | | | 219/491 |
| 2018/0144960 A1 * | 5/2018 | Su ..................... | H01L 21/67288 |
| 2018/0323095 A1 * | 11/2018 | Peh .................. | H01L 21/67265 |
| 2021/0220949 A1 | 7/2021 | Moffatt et al. | |
| 2022/0084832 A1 | 3/2022 | Cui et al. | |

FOREIGN PATENT DOCUMENTS

| | | |
|---|---|---|
| CN | 109994395 A | 7/2019 |
| JP | 2005026668 A | 1/2005 |
| JP | 2022-039342 A | 3/2022 |
| KR | 20160101305 A | 8/2016 |
| KR | 20220077003 A | 6/2022 |
| WO | WO 2008/069513 A1 | 6/2008 |

OTHER PUBLICATIONS

PCT International Search Report and Written Opinion for PCT/US2023/027586 dated Nov. 7, 2023.

* cited by examiner

*Primary Examiner* — Stephen D Meier
*Assistant Examiner* — Quang X Nguyen
(74) *Attorney, Agent, or Firm* — Moser Taboada

(57) ABSTRACT

Methods and apparatus for processing a substrate is provided herein. For example, the method comprises prior to processing a substrate, obtaining a first measurement at a first point along a surface of the substrate, in a process chamber processing the substrate in a presence of an electric field, subsequent to processing the substrate, obtaining a second measurement at the first point along the surface of the substrate, and determining whether substrate warpage occurred based upon analysis of the first measurement and the second measurement.

14 Claims, 3 Drawing Sheets

METHODS AND APPARATUS FOR PROCESSING A SUBSTRATE

FIELD

Embodiments of the disclosure generally relate to methods and apparatus for processing substrates, and for example, to methods and apparatus for real-time warpage monitoring for processed substrates.

BACKGROUND

Substrate level (wafer) warpage (e.g., bow upwards or downwards) can be a severe problem in high volume production (deposition). For example, in advanced nodes, there is increasing density of features on chip & chips on substrate. Stress analysis and stress relief methods are vital for device functionality. Thus, stress monitoring methods are essential. For example, real-time substrate warpage can be an excellent indicator for stress accumulation/change during substrate process sequencing. For example, the substrate can sometimes experience notable change of substrate warpage after being heated (e.g., heating using degas, plasma, high temp heater, etc.). Conventional methods and apparatus, however, are not configured to monitor real-time substrate warpage. For example, the substrate, typically, has to be cooled prior to monitoring substrate warpage, which can increase overall processing time and decrease throughput. Moreover, sometimes when a substrate is cooled down for monitoring, the cooled substrate warpage can be different from a substrate that is hot (e.g., inside the process chamber). Thus, obtaining an accurate analysis on warpage using ex-situ measurement is difficult, and ex-situ warpage measurement only gives end result, but does not provide a user with information on how the substrate is being changed during processing.

Therefore, the inventors describe herein improved methods and apparatus for real-time warpage monitoring for processed substrates.

SUMMARY

Methods and apparatus for processing a substrate are provided herein. In some embodiments, a method for processing a substrate comprises prior to processing a substrate, obtaining a first measurement at a first point along a surface of the substrate, in a process chamber processing the substrate in a presence of an electric field, subsequent to processing the substrate, obtaining a second measurement at the first point along the surface of the substrate, and determining whether substrate warpage occurred based upon analysis of the first measurement and the second measurement.

In accordance with at least some embodiments, a non-transitory computer readable storage medium has instructions stored thereon that when executed by a processor perform a method for processing a substrate comprises prior to processing a substrate, obtaining a first measurement at a first point along a surface of the substrate, in a process chamber processing the substrate in a presence of an electric field, subsequent to processing the substrate, obtaining a second measurement at the first point along the surface of the substrate, and determining whether substrate warpage occurred based upon analysis of the first measurement and the second measurement.

In accordance with at least some embodiments, an apparatus for processing a substrate comprise a process chamber configured to process a substrate, an apparatus configured to obtain measurements along a surface of the substrate, and a controller configured to prior to processing the substrate, obtain a first measurement at a first point along the surface of the substrate, in the process chamber processing the substrate in a presence of an electric field, subsequent to processing the substrate, obtain a second measurement at the first point along the surface of the substrate, and determine whether substrate warpage occurred based upon analysis of the first measurement and the second measurement.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
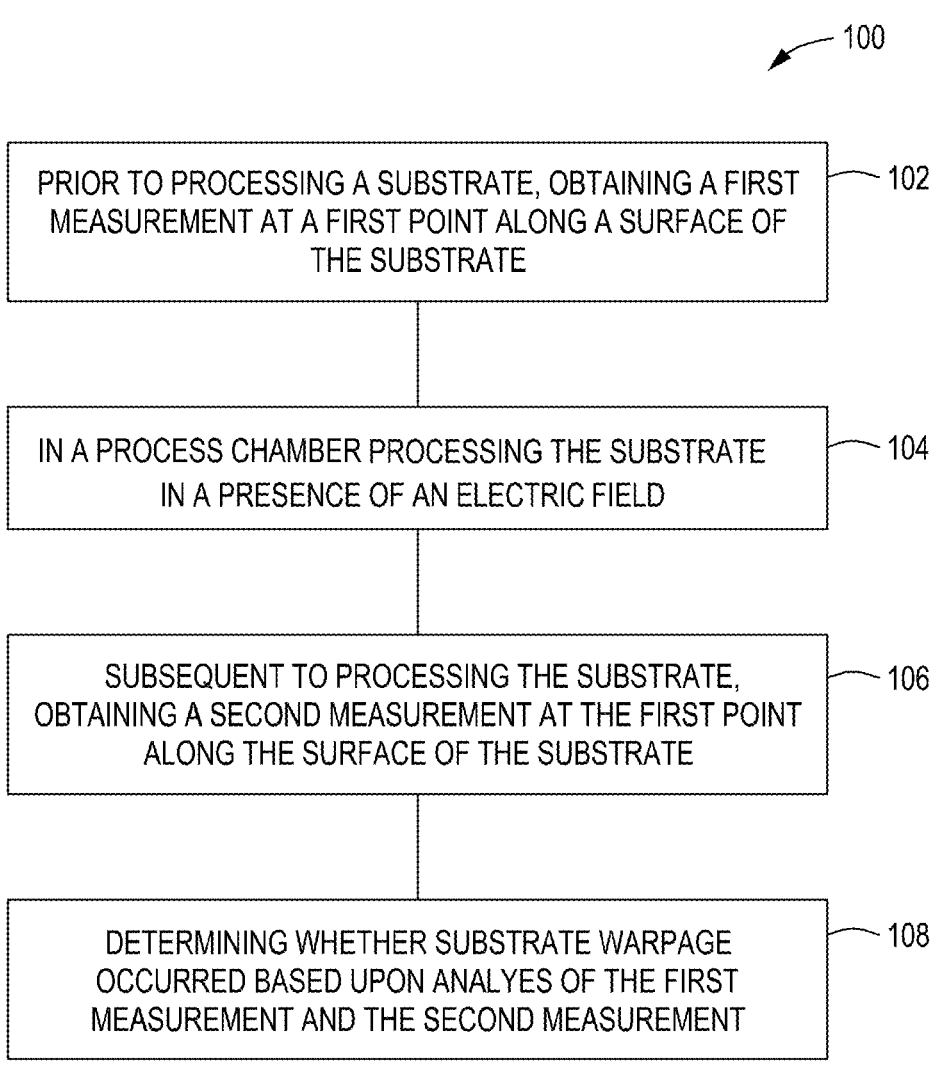
FIG. 1 is a flowchart of a method for processing a substrate, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a methods and apparatus for processing a substrate are provided herein. For example, methods and apparatus described herein use one or more sensors that are positioned (installed) near a slit valve position of a processing chamber/platform (e.g., an integrated tool). In at least some embodiments, a displacement sensor can be configured to monitor substrate bow/warpage using a pre-measurement and a post-measurement, e.g., using triangulation. In at least some embodiments, the pre-measurement and the post-measurement can be obtained prior to and after physical vapor deposition (PVD). For example, given the known relative positions of a laser emitter and detector (e.g., an RS-CMOS detector) of the displacement sensor, a position of a target (e.g., max and min of a processed substrate) can be calculated by determining a location of a reflected beam spot on the detector. The accuracy of the measurement can be <10 µm at a sampling cycle<1 ms.

Figure 2:
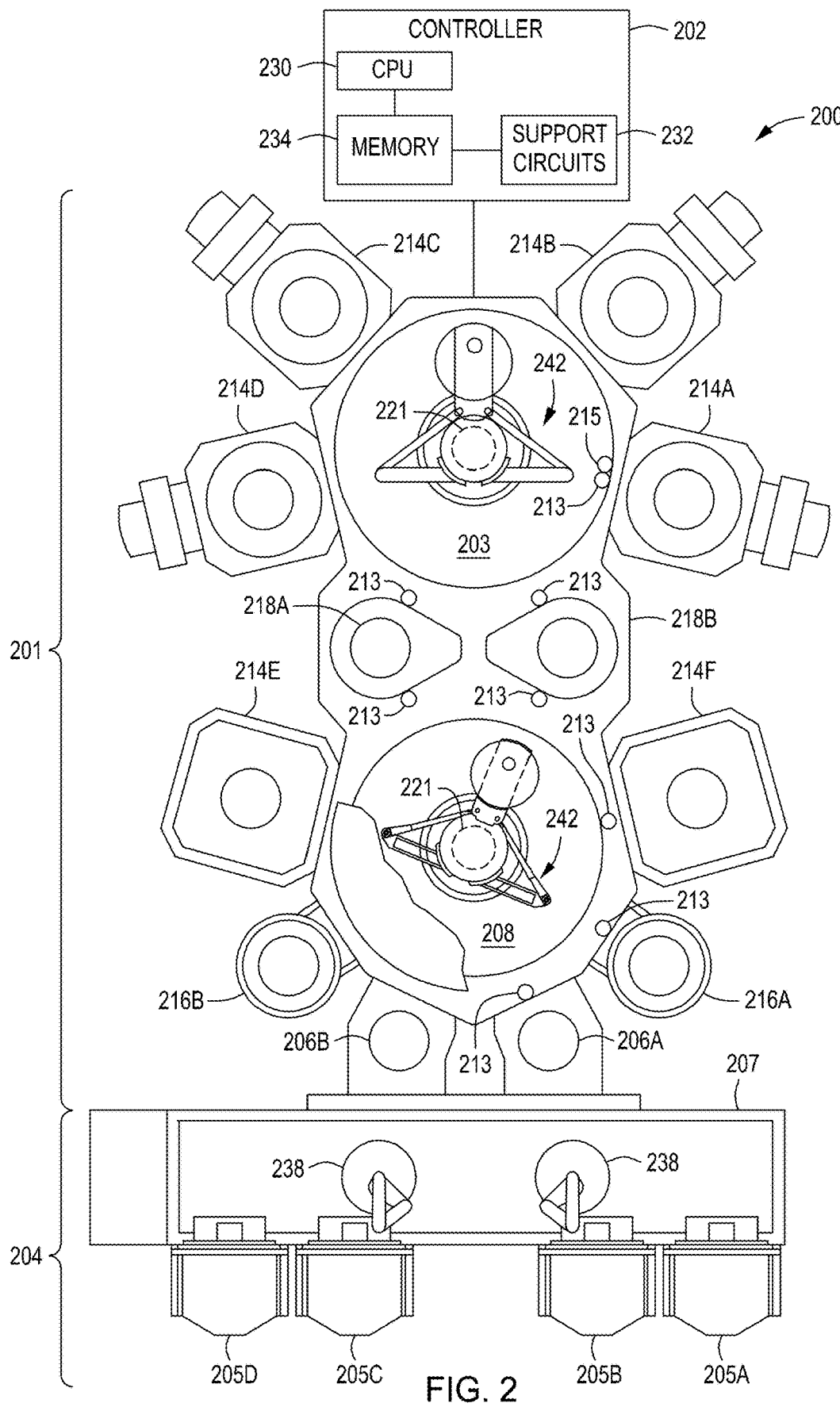
FIG. 2 is a diagram of an apparatus for performing the method of FIG. 1, in accordance with at least some embodiments of the present disclosure.

FIG. 1 is a flowchart of a method 100 for processing a substrate, and FIG. 2 is a tool 200 (or apparatus) that can used for conducting the method 100 (e.g., configured to process a substrate), in accordance with at least some embodiments of the present disclosure.

The method 100 may be performed in the tool 200 which can include any suitable process chambers configured for one or more of physical vapor deposition (PVD), chemical vapor deposition (CVD) and/or atomic layer deposition (ALD), such as plasma enhanced ALD or thermal ALD (e.g., no plasma formation). Examples of processing systems that may be used to perform the inventive methods disclosed herein may include, but are not limited to, the one or more process chambers commercially available from Applied Materials, Inc., of Santa Clara, California. Other process chambers, including those from other manufacturers, may also be suitably used in connection with the teachings provided herein.

The tool 200 can be embodied in individual process chambers that may be provided in a standalone configuration or as part of a cluster tool, for example, an integrated tool (the tool 200) described below with respect to FIG. 2. Examples of the integrated tool can include, but are not limited to, the one or more process chambers commercially available from Applied Materials, Inc., of Santa Clara, California. The methods described herein may be practiced using other cluster tools having suitable process chambers coupled thereto, or in other suitable process chambers. For example, in some embodiments, the inventive methods discussed above may be performed in an integrated tool such that there are limited or no vacuum breaks between processing steps. For example, reduced vacuum breaks may limit or prevent contamination (e.g., oxidation) of one or more metal layers or other portions of the substrate.

The integrated tool includes processing platform 201 (a vacuum-tight processing platform), a factory interface 204, and a controller 202. The processing platform 201 comprises multiple process chambers, such as 214A, 214B, 214C, and 214D operatively coupled to a transfer chamber 203 (vacuum substrate transfer chamber) and process chambers 214E and 214F operatively coupled to a buffer chamber 208 (vacuum substrate buffer chamber).

The factory interface 204 is operatively coupled to the buffer chamber 208 by one or more load lock chambers (two load lock chambers, such 206A and 206B shown in FIG. 2). In at least some embodiments, one of the buffer chamber 208 or the transfer chamber 203 of the tool 200 can omitted. One or more modules or channels can be provided between the buffer chamber 208 and the transfer chamber 203 and can be configured to receive one or more substrates from the buffer chamber 208 and/or the transfer chamber 203. In at least some embodiments, a module 218A and a module 218B are provided between the buffer chamber 208 and the transfer chamber 203 and are configured to receive one or more substrates from the buffer chamber 208 and/or the transfer chamber 203 during operation, as will be described in greater detail below. As noted above, the module 218A and a module 218B can have transparent cover.

In some embodiments, the factory interface 204 comprises a docking station 207, a factory interface robot 238 to facilitate the transfer of one or more semiconductor substrates (wafers). The docking station 207 is configured to accept one or more front opening unified pod (FOUP). Four FOUPS, such as 205A, 205B, 205C, and 205D are shown in the embodiment of FIG. 2. The factory interface robot 238 is configured to transfer the substrates from the factory interface 204 to the processing platform 201 through the load lock chambers, such as 206A and 206B. Each of the load lock chambers 206A and 206B have a first port coupled to the factory interface 204 and a second port coupled to the transfer chamber 203. The load lock chambers 206A and 206B are coupled to a pressure control system (not shown) which pumps down and vents the load lock chambers 206A and 206B to facilitate passing the substrates between the vacuum environment of the buffer chamber 208 and the substantially ambient (e.g., atmospheric) environment of the factory interface 204. In at least some embodiments, the buffer chamber 208 can be maintained at a substantially ambient environment. In embodiments when the buffer chamber 208 is not used, the load lock chambers 206A and 206B facilitate passing the substrates between the transfer chamber 203 and the factory interface 204. The buffer chamber 208 and the transfer chamber 203 each have a vacuum robot 242 positioned to transfer/receive one or more substrates. For example, the vacuum robot 242 of the buffer chamber 208 is capable of receiving/transferring the substrates 221 between the load lock chambers 206A and 206B, the process chambers 214E and 214F, and the modules 218A and 218F. Similarly, the vacuum robot 242 of the transfer chamber 203 is capable of receiving/transferring the substrates 221 between the process chambers 214A, 214B, 214C, and 214D and the modules 218A and 218F.

In some embodiments, the process chambers 214A, 214B, 214C, 214D, 214E, and 214F can comprise at least an ALD chamber, a CVD chamber, a PVD chamber, an e-beam deposition chamber, and/or an electroplating, electroless (EEP) deposition chamber. Likewise, in some embodiments, one or more optional service chambers (shown as 216A and 216B) may be coupled to the buffer chamber 208. The service chambers 216A and 216B may be configured to perform other substrate processes, such as degassing, bonding, chemical mechanical polishing (CMP), substrate cleaning (preclean), wafer cleaving, etching, plasma dicing, orientation, substrate metrology, cool down, and the like.

In at least some embodiments, one or more temperature measurement apparatus 215 can be installed, using one or more suitable installment devices (e.g., nuts, bolts adhesives, bonds, etc.), adjacent to the process chambers 214A, 214B, 214C, 214D, 214E, and 214F the service chambers 216A and 216B, the modules 218A and 218F, and/or the load lock chambers 206A and 206B. The one or more temperature measurement apparatus 215 can be configured to obtain a temperature measurement at a first point or a second point, different from the first point, as will be described in greater detail below.

Figure 3:
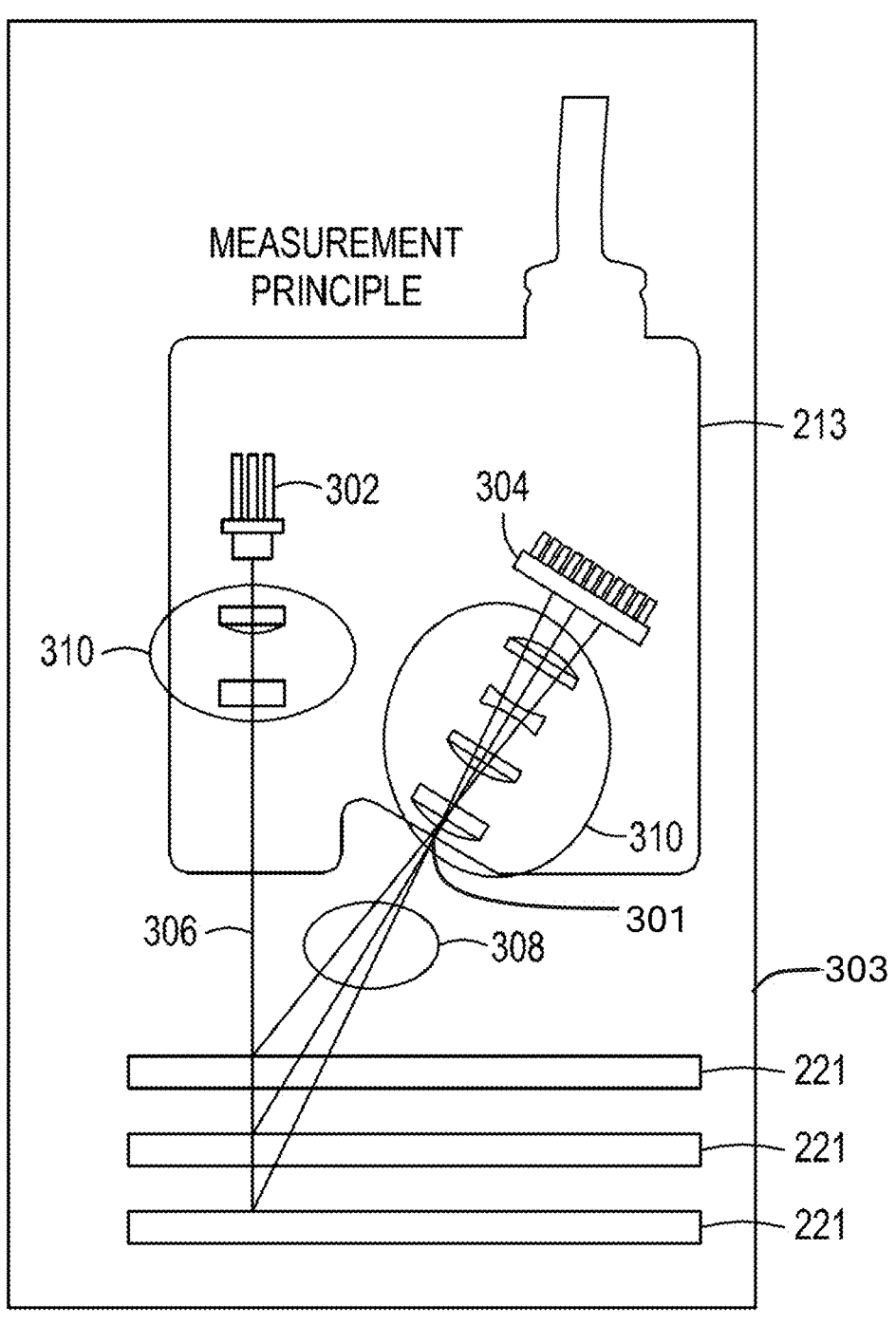
FIG. 3 is a diagram of a displacement sensor configured for use with the apparatus of FIG. 2, in accordance with at least some embodiments of the present disclosure.

In at least some embodiments, one or more displacement apparatus can be installed, using one or more suitable installment devices (e.g., nuts, bolts adhesives, bonds, etc.) adjacent to the process chambers 214A, 214B, 214C, 214D, 214E, and 214F the service chambers 216A and 216B, the modules 218A and 218F, and/or the load lock chambers 206A and 206B. For example, the one or more displacement apparatus can be a one or more laser displacement sensors, or other suitable apparatus capable of obtaining measurements along a surface of a substrate, as will be described in greater detail below. The one or more displacement sensors 213 can comprise an emitter 302 and a detector 304. The emitter 302 is configured to emit a beam 306 toward a surface of the substrate 221, or a plurality of substrates (such as the three shown in FIG. 3). Similarly, the detector 304 is configured to detect one or more beams 308 reflected from the surface of the substrate 221. In at least some embodiments, one or more filters, lenses, or other optical apparatus 310 can be used in conjunction with the emitter 302 and the detector 304.

Additionally, the one or more displacement sensors 213 can be installed adjacent to an opening (e.g., a slit valve position 301 of process chamber 303 See FIG. 3) leading to any of the process chambers 214A, 214B, 214C, 214D, 214E, and 214F the service chambers 216A and 216B, the modules 218A and 218F, and/or the load lock chambers 206A and 206B. For example, in at least some embodiments, the one or more displacement sensors 213 can be installed adjacent to a slit-valve (not shown) that opens to the 214A, 214B, 214C, 214D, 214E, and 214F the service chambers 216A and 216B, the modules 218A and 218F, and/or the load lock chambers 206A and 206B.

The controller 202 controls the operation of the tool 200 using a direct control of the process chambers 214A, 214B, 214C, 214D, 214E, and 214F, and the apparatus 212, or alternatively, by controlling the computers (or controllers) associated with the process chambers 214A, 214B, 214C, 214D, 214E, and 214F, the apparatus 212, and the tool 200. In operation, the controller 202 enables data collection and feedback from the respective chambers and systems to optimize performance of the tool 200. The controller 202 generally includes a central processing unit 230, a memory 234, and a support circuit 232. The central processing unit 230 may be any form of a general-purpose computer processor that can be used in an industrial setting. The support circuit 232 is conventionally coupled to the central processing unit 230 and may comprise a cache, clock circuits, input/output subsystems, power supplies, and the like. Software routines, such as processing methods as described above may be stored in the memory 234 (e.g., non-transitory computer readable storage having instructions stored thereon) and, when executed by the central processing unit 230, transform the central processing unit 230 into a specific purpose computer (e.g., the controller 202). The software routines may also be stored and/or executed by a second controller (not shown) that is located remotely from the tool 200.

Continuing with reference to FIG. 1, initially one or more substrates, thermal modular assembly, or the like may be loaded into one or more of the Four FOUPS, such as 205A, 205B, 205C, and 205D (FIG. 2). For example, in at least some embodiments, a substrate 221 (wafer) can be loaded into FOUP 205B. The substrate 300 can have a diameter of 150 mm, 200 mm, 300 mm, etc. The substrate 221 can be formed from germanium, silicon, silicon carbide, silicon oxide, etc. In at least some embodiments, the substrate 221 can have a 300 mm diameter and can formed from silicon. In at least some embodiments, one or more metal layers can be deposited on the substrate 221. For example, the one or more metal layers can comprise aluminum, cobalt, copper, nitride, titanium, tantalum, etc. In at least some embodiments, the substrate 221 can comprise a metal layer comprising cobalt and tungsten.

Once loaded, the factory interface robot 238 can transfer the substrate 221 from the factory interface 204 to the processing platform 201 through, for example, the load lock chamber 206A. The vacuum robot 242 can transfer the substrate 221 from the load lock chamber 206A to and from one or more of the process chambers 214A, 214B, 214C, 214D, 214E, and 214F and/or the service chambers 216A and 216B.

For example, in at least some embodiments, the vacuum robot 242 can transfer the substrate 221 from the load lock chamber 206A to the service chamber 216A where one or more of degassing, bonding, chemical mechanical polishing (CMP), substrate cleaning (preclean), wafer cleaving, etching, plasma dicing, orientation, substrate metrology, cool down can be performed. For example, in at least some embodiments, a precleaning process can be performed on the substrate 221 to remove oxide that may have formed on the metal layer. In at least some embodiments, prior to or after processing in the substrate 221 in the service chamber 216A, the one or more displacement sensors 213 can be used to obtain a first measurement and/or a second measurement at a first point along the substrate 221, as will be described in greater detail below.

Next, the vacuum robot 242 of the buffer chamber 208 can transfer the substrate 221 from the service chamber 216A to one of the modules 218A and 218B (e.g., for cool down). Again, prior to or after transferring the substrate 221 to the modules 218A and 218B, the one or more displacement sensors 213 can be used to obtain a first measurement and/or a second measurement at a first point along the substrate 221, as will be described in greater detail below.

Next, at 102, the method 100 comprises prior to processing a substrate, obtaining a first measurement at a first point along a surface of the substrate. For example, prior to the vacuum robot 242 of the transfer chamber 203 transferring the substrate 221 from one of the modules 218A and 218B to one of the process chambers 214A, 214B, 214C, and 214D where one or more deposition processes may be performed on the substrate 221, under control of the controller 202, the one or more displacement sensors 213 can obtain a first measurement at a first point along the substrate 221. For example, as noted above, the emitter 302 of the laser displacement sensor is configured to emit a beam 306 toward a surface of the substrate 221 (or a plurality of substrates). Similarly, the detector 304 is configured to detect the one or more beams 308 reflected from the surface of the substrate 221. In at least some embodiments, the first measurement can be based on a position of the emitter 302 and a position of the detector 304 relative to the substrate 221 and a location of the one or more beams 308 spot detected by the detector 304. One or more filters, lenses, or other optical apparatus 310 can be used in conjunction with the emitter 302 and the detector 304 of the laser displacement sensor.

Next, at 104, the method 100 comprises in a process chamber, in a presence of an electric field processing the substrate 221. For example, the substrate 221 can be transferred to the process chamber 214A where physical vapor deposition can be performed on the substrate 221. For example, during physical vapor deposition one or more additional metal layers (e.g., a relatively thick, highly uniform, low-temperature film comprising at least one of aluminum nitride, aluminum oxide, gallium arsenide, germanium, indium tin oxide, lead zirconium titanate, scandium doped aluminum nitride, silicon carbide, etc.) may be deposited on the metal layer previously deposited on the substrate 221. The additional metal layers can be used for one or more MTM (More than Moore) applications, such as power devices, MEMS, RF, photonics, and packaging technologies, e.g., TSV.

Next, at 106, the method 100 comprises subsequent to processing the substrate, obtaining a second measurement at the first point along the surface of the substrate. For example, in view of the electric field that is present during a deposition process (e.g., physical vapor deposition or chemical vapor deposition), warping/bowing may occur during physical vapor deposition. Accordingly, after the deposition process, under control of the controller 202, as described above, the emitter 302 emits the beam 306 toward a surface of the substrate 221 (or a plurality of substrates), and the detector 304 detects the one or more beams 308 reflected from the surface of the substrate 221 to obtain the second measurement, e.g., based on a position of the emitter 302 and a position of the detector 304 relative to the substrate 221 and a location of the one or more beams 308 spot detected by the detector 304.

Next, at 108, the method 100 comprises determining whether substrate warpage occurred based upon analysis of the first measurement and the second measurement. For example, in at least some embodiments, the controller 202 can compare the first measurement with the second measurement to determine an amount of warpage/bow. For example, with the controller 202 having the known relative positions of the emitter 302 and detector 304, a position (e.g., the first position along the substrate) of a target (e.g., max and min of a processed substrate), the amount of warpage/bow can be calculated by determining a location of the reflected beam spot on the detector 304—an accuracy of the measurement can be about ≤10 μm at a sampling cycle of about ≤1 ms. For example, a comparison that indicates an increase in distance at the first point between the substrate 221, the emitter 302, and the detector 304, can be indicative to a concave warpage/bow to the controller 202. Similarly, a comparison that indicates a decrease in distance at the first point between the substrate 221, the emitter 302, and the detector 304, can be indicative to a convex warpage/bow to the controller 202. In at least some embodiments, the controller 202 can compare the distance change with a predetermined amount (e.g., stored in the memory 234) that allows the controller 202 to determine if a maximum (predetermined) amount of acceptable warpage/bow has occurred. In at least some embodiments, the method 100 comprises triggering a fault indication when substrate warpage is determined. For example, if the controller 202 determines that the amount of warpage/bow equals or exceeds the predetermined amount, the controller 202 can trigger an alert (visual/audio) and/or stop processing of the substrate 221.

In at least some embodiments, the method 100 can comprise obtaining a temperature measurement at the first point or a second point, different from the first point, wherein determining whether substrate warpage occurred is further based upon analysis of the temperature measurement.

The method 100 comprising operations 102-108 can be repeated for each of the process chambers 214A, 214B, 214C, 214D, 214E, and 214F and/or the service chambers 216A and 216B. The method 100 comprising operations 102-108 can also be used in a similar manner in conjunction with the modules 218A and 218F and/or the load lock chambers 206A and 206B, e.g., metrology.

While the foregoing is directed to embodiments of the present disclosure, other and further embodiments of the disclosure may be devised without departing from the basic scope thereof.

The invention claimed is:

1. A method for processing a substrate, comprising:
   prior to processing a substrate, obtaining a first measurement at a first point along a surface of the substrate;
   in a process chamber processing the substrate in a presence of an electric field;
   subsequent to processing the substrate, obtaining a second measurement at the first point along the surface of the substrate; and
   determining whether substrate warpage occurred based upon analysis of the first measurement and the second measurement;
   wherein obtaining the first measurement and the second measurement is performed using a laser displacement sensor comprising an emitter and a detector, and
   wherein the laser displacement sensor is disposed adjacent to a slit valve position on the process chamber.

2. The method of claim 1, wherein the first measurement and the second measurement are based on a position of the emitter and a position of the detector relative to the substrate and a location of a reflected beam spot detected by the detector.

3. The method of claim 1, further comprising obtaining a temperature measurement at the first point or a second point, different from the first point, wherein determining whether substrate warpage occurred is further based upon analysis of the temperature measurement.

4. The method of claim 1, further comprising triggering a fault indication when substrate warpage is determined.

5. The method of claim 1, wherein the substrate is made from at least one of aluminum, copper, or tantalum.

6. A non-transitory computer readable storage medium having instructions stored thereon that when executed by a processor perform a method for processing a substrate, comprising:
   prior to processing a substrate, obtaining a first measurement at a first point along a surface of the substrate;
   in a process chamber processing the substrate in a presence of an electric field;
   subsequent to processing the substrate, obtaining a second measurement at the first point along the surface of the substrate; and
   determining whether substrate warpage occurred based upon analysis of the first measurement and the second measurement;
   wherein obtaining the first measurement and the second measurement is performed using a laser displacement sensor comprising an emitter and a detector, and
   wherein the laser displacement sensor is disposed adjacent to a slit valve position on the process chamber.

7. The non-transitory computer readable storage medium of claim 6, wherein the first measurement and the second measurement are based on a position of the emitter and a position of the detector relative to the substrate and a location of a reflected beam spot detected by the detector.

8. The non-transitory computer readable storage medium of claim 6, further comprising obtaining a temperature measurement at the first point or a second point, different from the first point, wherein determining whether substrate warpage occurred is further based upon analysis of the temperature measurement.

9. The non-transitory computer readable storage medium of claim 6, further comprising triggering a fault indication when substrate warpage is determined.

10. The non-transitory computer readable storage medium of claim 6, wherein the substrate is made from at least one of aluminum, copper, or tantalum.

11. An apparatus for processing a substrate, comprising:
   a process chamber configured to process a substrate;
   an apparatus configured to obtain measurements along a surface of the substrate; and
   a controller configured to:
   prior to processing the substrate, obtain a first measurement at a first point along the surface of the substrate;
   in the process chamber processing the substrate in a presence of an electric field;
   subsequent to processing the substrate, obtain a second measurement at the first point along the surface of the substrate; and
   determine whether substrate warpage occurred based upon analysis of the first measurement and the second measurement;

wherein the apparatus for obtaining measurements along the surface of the substrate is a laser displacement sensor comprising an emitter and a detector, and wherein the laser displacement sensor is disposed adjacent to a slit valve position on the process chamber.

12. The apparatus of claim 11, wherein the first measurement and the second measurement are based on a position of the emitter and a position of the detector relative to the substrate and a location of a reflected beam spot detected by the detector.

13. The apparatus of claim 11, further comprising a temperature measurement apparatus that is configured to obtain a temperature measurement at the first point or a second point, different from the first point, wherein the controller is further configured to determine whether substrate warpage occurred based on the temperature measurement.

14. The apparatus of claim 11, wherein the controller is further configured to trigger a fault indication when substrate warpage is detected.

\* \* \* \* \*